(12) United States Patent
Castro

(10) Patent No.: US 8,917,534 B2
(45) Date of Patent: Dec. 23, 2014

(54) PATH ISOLATION IN A MEMORY DEVICE

(75) Inventor: Hernan A. Castro, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/496,378

(22) PCT Filed: Sep. 9, 2011

(86) PCT No.: PCT/US2011/051073
§ 371 (c)(1),
(2), (4) Date: Sep. 21, 2012

(87) PCT Pub. No.: WO2013/036244
PCT Pub. Date: Mar. 14, 2013

(65) Prior Publication Data
US 2014/0169089 A1   Jun. 19, 2014

(51) Int. Cl.
| | |
|---|---|
| *G11C 11/00* | (2006.01) |
| *G11C 13/00* | (2006.01) |
| *G11C 16/06* | (2006.01) |
| *G11C 7/10* | (2006.01) |
| *G11C 7/12* | (2006.01) |
| *G11C 13/02* | (2006.01) |

(52) U.S. Cl.
CPC ........ *G11C 13/0023* (2013.01); *G11C 13/0038* (2013.01); *G11C 16/06* (2013.01); *G11C 7/10* (2013.01); *G11C 13/0004* (2013.01); *G11C 7/12* (2013.01); *G11C 13/0028* (2013.01); *G11C 13/004* (2013.01); *G11C 13/02* (2013.01); *G11C 13/0069* (2013.01)
USPC .......................................... 365/148; 365/163

(58) Field of Classification Search
CPC ................. G11C 13/0069; G11C 13/0004
USPC .................................................. 365/148, 163
See application file for complete search history.

(56) References Cited

U.S. PATENT DOCUMENTS 6,625,054 B2 * 9/2003 Lowrey et al. ................ 365/148
2006/0279979 A1   12/2006 Lowrey et al.
(Continued)

OTHER PUBLICATIONS

International Search Report mailed Feb. 9, 2012 in International Application No. PCT/US2011/051073.
(Continued)

*Primary Examiner* — Huan Hoang
(74) *Attorney, Agent, or Firm* — Schwabe, Williamson & Wyatt, P.C.

(57) ABSTRACT

Embodiments of the present disclosure describe techniques and configurations for word-line path isolation in a phase change memory (PCM) device. In one embodiment, a memory device includes a memory cell of a memory device, a bit-line coupled to the memory cell, a word-line coupled to the memory cell, a bit-line electrode coupled to the bit-line, a word-line electrode coupled to the word-line, current-limiting circuitry of a selection module coupled to one of the word-line electrode and the bit-line electrode having a lower potential, the current-limiting circuitry to facilitate a selection operation of the memory cell by the selection module, sensing circuitry coupled to the one of the word-line electrode and the bit-line electrode having the lower potential, the sensing circuitry to perform a read operation of the memory cell, and write circuitry coupled to the one of the word-line electrode and the bit-line electrode having the lower potential, the write circuitry to perform a write operation of the memory cell. Other embodiments may be described and/or claimed.

21 Claims, 4 Drawing Sheets

(56) References Cited

U.S. PATENT DOCUMENTS

2008/0247213 A1    10/2008   Fasoli et al.
2011/0182109 A1*   7/2011   Ikeda et al. ................... 365/148

OTHER PUBLICATIONS

International Preliminary Report on Patentability mailed Mar. 20, 2014 from International Application No. PCT/US2011/051073.

* cited by examiner

US 8,917,534 B2

PATH ISOLATION IN A MEMORY DEVICE

This application is a national stage application of PCT application PCT/US2011/051073, filed Sep. 9, 2011, entitled "PATH ISOLATION IN A MEMORY DEVICE," and claims priority to the PCT application.

FIELD

Embodiments of the present disclosure generally relate to the field of integrated circuits, and more particularly, to techniques and configurations for path isolation in a memory device.

BACKGROUND

Presently, a memory device such as, for example, a phase change memory (PCM) device may use a higher potential path (e.g., bit-line path) of alternative paths (e.g., bit-line path or word-line path) to carry out read (e.g., sense) and/or write operations (e.g., set or reset). Generally, a selection operation is performed to select a memory cell of the memory device that is to receive the read/write operations. Such current memory device configurations may present a variety of challenges. For example, high displacement currents through a memory cell during read/write operations may disturb or damage the memory cell. Further, a challenge may arise when transitioning from the selection phase to the read/write operation. The transition may impose critical timing requirements to prevent damage to the selected memory cell or to maintain a selected state of the memory cell. Another challenge may include a delay in resolving a signal during the read/write operation when the higher potential path has a relatively larger capacitance than an alternative path. The delay may adversely affect throughput or speed of the read/write operation. Furthermore, circuitry that performs read and/or write operations may operate at relatively higher voltages when coupled to the higher potential path, which may result in the read/write circuitry operating at slower speeds and consuming larger area of the memory device. The above challenges may constrain a maximum tile size of the memory device and require the use of more complex and/or costly semiconductor fabrication technology to fabricate smaller tiles.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide techniques and configurations for path isolation in a memory device. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
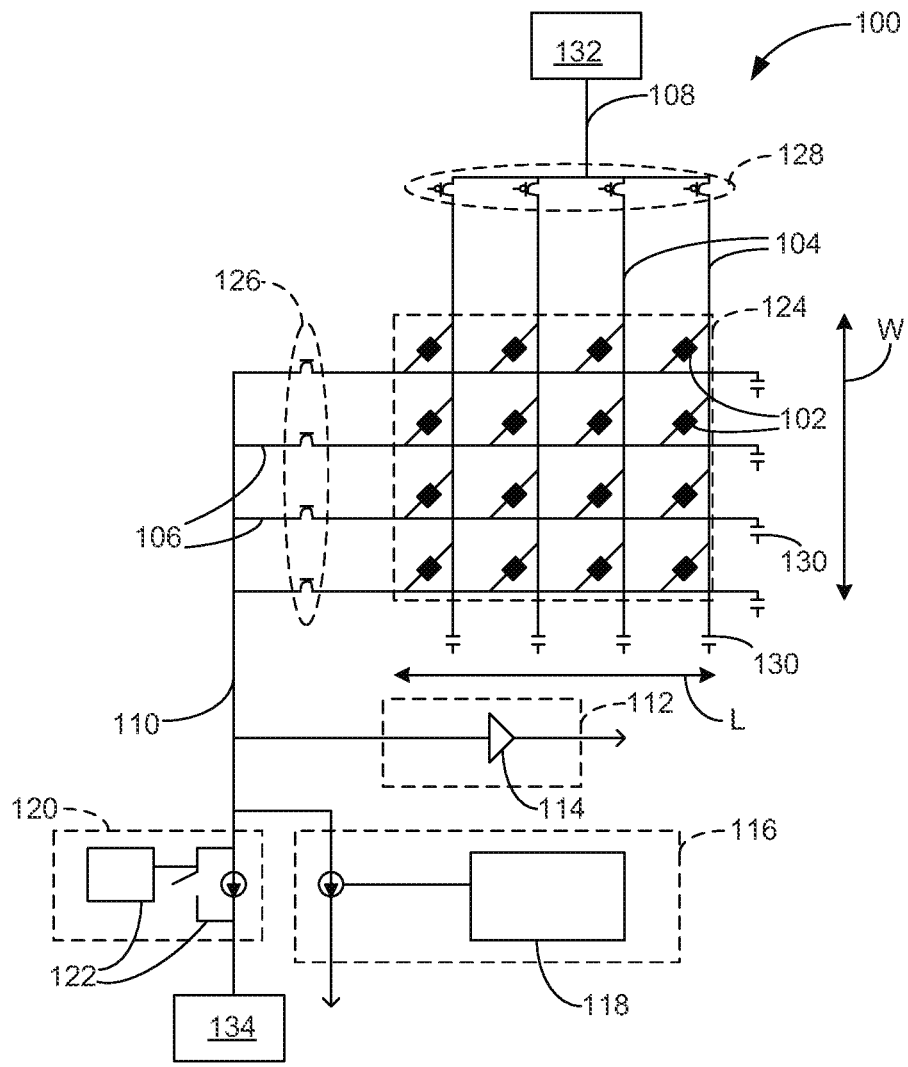
FIG. 1 schematically illustrates an example configuration for a memory device in accordance with some embodiments.

FIG. 1 schematically illustrates an example configuration for a memory device 100 in accordance with some embodiments. According to various embodiments, the memory device 100 includes one or more memory cells 102, which may be configured in an array as shown. The one or more memory cells 102 can include, for example, a phase change material such as a chalcogenide glass that can be switched between crystalline and amorphous states with the application of heat produced by an electric current. The state (e.g., crystalline/amorphous) of a phase change material may correspond with a logical value (e.g., 1 or 0) of the one or more memory cells 102. In such embodiments, the memory device 100 may be a phase change memory (PCM) device including, for example, a phase change memory and switch (PCMS) device. Subject matter is not limited in this regard, and the memory device 100 may include other types of memory devices that benefit from the principles described herein.

The memory device 100 may further include one or more bit-lines 104 and one or more word-lines 106 coupled to the one or more memory cells 102, as shown. The one or more bit-lines 104 and word-lines 106 may be configured such that each of the one or more memory cells 102 is disposed at an intersection of each individual bit-line and word-line. A voltage or bias can be applied to a target memory cell of the one or more memory cells 102 using the one or more word-lines 106 and the one or more bit-lines 104 to select the target cell for a read or write operation. One or more bit-line drivers 128 may be coupled to the one or more bit-lines 104 and one or more word-line drivers 126 may be coupled to the one or more word-lines 106 to facilitate decoding/selection of the one or more memory cells 102, as shown. One or more capacitors 130 may be coupled to the one or more bit-lines 104 and the one or more word-lines 106, as shown. The one or more capacitors 130 may represent parasitic elements in one or more embodiments.

The memory device 100 may include one or more tiles 124. The one or more tiles 124 may comprise a portion of the array of one or more word-lines 106, bit-lines 104, and memory cells 102 that is treated as a discrete unit during a selection operation of a target memory cell. That is, in some embodiments, each of the one or more tiles 124 is a unit of the array that is biased to select the target memory cell (e.g., a bit) in the array. In the depicted embodiment, the one or more tiles 124 comprise an array of four word-lines and four bit-lines (4 WL×4 BL); however, other tile sizes can be used in other embodiments including, for example, a tile size of one thousand word-lines by one thousand bit-lines (1000 WL×1000 BL). The one or more tiles 124 may each include a tile size having a length dimension, L, which is a linear dimension that extends in a direction that is parallel to a lengthwise dimension of the one or more word-lines 106 and a width dimension, W, which is a linear dimension that extends in a direction that is parallel to a lengthwise dimension of the one or more bit-lines 104, as shown. The one or more tiles 124 may be part of any memory layer of a stacked memory configuration in some embodiments. For example, the one or more tiles 124 may be part of a memory layer formed on another memory layer, in some embodiments. Additional word-line drivers and/or bit-lines drivers may be provided for each memory layer.

The one or more bit-lines 104 are coupled to a bit-line electrode 108 or path, which may be further coupled to a bit-line supply 132 that is configured to provide an electrical supply for the one or more bit-lines 104. The one or more word-lines 106 are coupled to a word-line electrode 110 or path, which may be further coupled to a word-line supply 134 that is configured to provide an electrical supply for the one or more word-lines 106. The bit-line electrode 108 and the word-line electrode 110 may each be a current path to the one or more memory cells 102. The word-line drivers 126 and the bit-line drivers 128 may each comprise single or multiple transistors per electrode according to various embodiments. For embodiments where multiple transistors are used for each of the word-line drivers 126 and the bit-line drivers 128, the multiple transistors may be coupled to additional voltage supplies using additional word-line and/or bit-line electrodes that may similarly comport with embodiments described herein.

According to various embodiments, the word-line electrode 110 has a relatively lower potential than the bit-line electrode 108. For example, the word-line electrode 110 may have a maximum voltage that is lower than a maximum voltage of the bit-line electrode 108. In some embodiments, the word-line electrode 110 may have a capacitance that is lower than a capacitance of the bit-line electrode 108.

In an embodiment, the memory device 100 includes sensing circuitry 112 coupled to the word-line electrode 110. The sensing circuitry 112 may use the word-line electrode 110 as an electrical node for performing a read operation, such as a sense operation, of the one or more memory cells 102. In one embodiment, the sensing circuitry 112 comprises a voltage comparator 114. For example, the sensing circuitry 112 may include a word-line load connected to the word-line electrode 110 to convert a current on the word-line electrode 110 to a voltage that is a first input to the voltage comparator 114. An equivalent word-line load may be connected to a reference current (not shown) to provide a voltage that is a second input to the voltage comparator 114. When a particular word-line and bit-line are selected in the array, the word-line load on the word-line electrode 110 may convert the current on the selected word-line to a voltage. Leakage components of the current can be mitigated by respectively selecting a bias for all other unselected word-lines and bit-lines that reduces or minimizes leakage. Capacitive components of the current can be mitigated by allowing sufficient time for the capacitive components to dissipate. The current that is converted to the first input to the voltage comparator 114 may correspond with the current of the target memory cell. The reference current may be selected such that the current of the target memory cell is lower than the reference current before snap-back of the target memory cell and higher than the reference current after snap-back of the target memory cell. In this manner, an output of the voltage comparator 114 may be indicative of a state of the target memory cell. A latch (not shown) may be coupled to the voltage comparator 114 to store information associated with the read operation.

The memory device 100 may further include write circuitry 116 coupled to the word-line electrode 110. The write circuitry 116 may use the word-line electrode 110 as an electrical node for performing a write operation, such as a set or reset operation, of the one or more memory cells 102. The write circuitry 116 may include a current profile generator 118 that generates a current profile (e.g., a current pulse) for performing the write operation.

Figure 2:
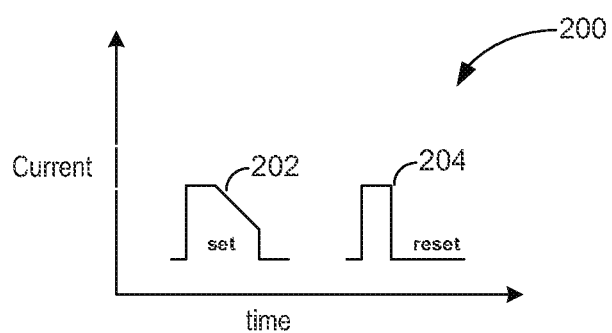
FIG. 2 schematically illustrates some example current profiles that can be used to set or reset a memory cell in accordance with some embodiments.

Referring briefly to FIG. 2, some example current profiles 202, 204 that can be used to set or reset a memory cell are illustrated in accordance with some embodiments. In an embodiment, the write circuitry 116 of FIG. 1 is configured to apply a current profile 202 having a trapezoid shape to set a selected memory cell and a current profile 204 having a rectangular shape to reset a selected memory cell. Other current profiles can be used in other embodiments. The current profile may be formed by controlling a magnitude, ramp rate, and width, of a current pulse.

Returning again to FIG. 1, the memory device 100 may further include components of a selection module 120 coupled to the word-line electrode 110. Current-limiting circuitry 122 of the selection module 120 may be coupled to the word-line electrode 110 to facilitate a selection operation of the one or more memory cells 102 using the word-line electrode 110. The selection operation may precede a read/write operation and place the target memory cell in a state to receive a read/write operation. During selection, a target memory cell may be moved from a subthreshold region of operation to a region of operation above a threshold region of operation by applying a voltage/bias across the target memory cell. The voltage bias to achieve selection of the target cell is provided by word-line and bit-line driver circuitry (e.g., of the selection module 120) of the respective target word-line and the target bit-line in conjunction with the current-limiting circuitry 122. The target word-line bias and the target bit-line bias are chosen such that, in combination, an overall bias is applied across the target cell that is sufficient to bring the target cell above threshold. In the present example, 'above threshold' may refer to a region of operation of a target memory cell (e.g., of the one or more memory cells 102) that is capable of conducting sufficient current for a write operation, although a smaller current may maintain the target cell in the region of operation. The transition from sub-threshold to the threshold or above threshold region may involve a 'snap-back' event where the voltage sustained by the target cell for a given current through the cell is suddenly reduced. The current-limiting circuitry 122 may limit the current of the word-line electrode 110 to prevent damaging the target memory cell with excessive current. That is, limiting the maximum current of the word-line electrode 110 may also limit the maximum current through the one or more memory cells 102. The limiting function may be ineffective during a time that the word-line electrode 110 and a word-line decoding path of the target word-line are charging to a steady state.

The current-limiting circuitry 122 may be placed on whichever of the word-line electrode 110 or the bit-line electrode 108 that has a lower capacitance in order to reduce or minimize a transient current after snap-back of one or more memory cells 102 to a level that reduces damage or disturbance of the one or more memory cells 102. In the depicted embodiment, the current-limiting circuitry 122 is placed on the word-line electrode 110.

In an embodiment, the current-limiting circuitry 122 comprises a current mirror circuit. The current-limiting circuitry 122 may comprise a transistor gate that is configured to limit a current of the word-line electrode 110 to a maximum current level. For example, the transistor may be an n-type transistor having a gate that is controlled to an analog level such that the transistor delivers up to a maximum desired current. The current-limiting circuitry 122 may be enabled by applying a gate voltage to the transistor. The selection module 120 may include additional control circuitry to facilitate decoding of a target memory cell of the one or more memory cells 102 such that the target memory cell is moved from a subthreshold region of operation to a region of operation above a threshold region of operation, the threshold being a function of current. In some embodiments, the word-line electrode 110 may have a parasitic leakage during a selection operation that is lower than a parasitic leakage of the bit-line electrode 108 during the selection operation.

The current-limiting circuitry 122, the sensing circuitry 112, and the write circuitry 116 may be coupled to an electrode path that is whichever of the word-line electrode 110 or the bit-line electrode 108 that has a lower potential. Using a common electrical node/load (e.g., the word-line electrode 110 of FIG. 1) for the sensing circuitry 112, the write circuitry 116, and the current-limiting circuitry 122 of the selection module 120 may provide a variety of benefits. For example, placing the sensing circuitry 112, the write circuitry 116, and the current-limiting circuitry 122 on the word-line electrode 110 may free the bit-line electrode 108 to be more capacitive without damaging the one or more memory cells 102 or hindering the speed of operation of the memory device 100. The bit-line electrode 108 can be used to provide charge for write operations such as set or reset operations, which may include capacitive techniques to provide the charge.

Further, the word-line electrode 110 may be a lower-potential node, which allows the sensing circuitry 112, the write circuitry 116, and the current-limiting circuitry 122 to operate at higher speeds, consume smaller area, and be formed using less complex technology. For example, level-shifters may be reduced or eliminated from the design of sensing circuitry 112, write circuitry 116, and current-limiting circuitry 122 coupled to the word-line electrode 110 allowing the use of smaller area for the circuitry. In another example, triple-well transistors may be reduced or eliminated in the sensing circuitry 112, the write circuitry 116, and the current-limiting circuitry 122, which may be costly and complex to fabricate. Additionally, the lower voltage word-line electrode 110 may provide a better ground signal for read operations such as sense operations than a higher voltage electrode. Combining the current-limiting circuitry 122 with sensing circuitry 112 and/or the write circuitry 116 on the same electrode (e.g., word-line electrode 110) may facilitate a transition from a selection operation to a read/write operation such as a sense, set, or reset operation. The transition may be less complex and faster than memory devices that do not combine the current-limiting circuitry 122 with sensing circuitry 112 and/or the write circuitry 116 on the same electrode because related functions are on the same electrode and do not involve critical transitions on the other electrode.

Another benefit of placing the write circuitry 116, the sensing circuitry 112, and the current-limiting circuitry 122 on the same electrode (e.g., the word-line electrode 110) is that a tile size of the one or more tiles 124 can be increased. For example, the one or more tiles 124 of the memory device 100 may have a width W that is less constrained than a width of a memory device having one or more of the write circuitry 116, the sensing circuitry 112, and the current-limiting circuitry 122 on the bit-line electrode 108. In an embodiment, the width W of the one or more tiles 124 may be greater than a length L of the one or more tiles 124, even in a case where each of the one or more tiles 124 has a same number of bit-lines and word-lines. In some embodiments, the one or more tiles 124 may have a different number of bit-lines and word-lines. A larger tile size of the one or more tiles 124 may facilitate the utilization of less costly and complex fabrication processes for circuitry that supports decoding functions in the memory device 100. For example, fewer drivers (e.g., the word-line drivers 126 and the bit-line drivers 128) may be needed for a larger tile size. In some embodiments, a single driver is used for each bit-line or word-line. The tile size of the one or more tiles 124 of memory device 100 may be constrained by factors such as capacitance on the word-line electrode 110 and maximum leakage per bit-line or maximum resistance per bit-line on the bit-line electrode 108.

Although the depicted memory device 100 shows an embodiment where the write circuitry 116, the sensing circuitry 112, and the current-limiting circuitry 122 are placed on the word-line electrode 110 having the relatively lower potential, such circuitry can all be placed on the bit-line electrode 108 having the relatively higher potential and still provide a variety of benefits. For example, in such embodiment, the benefits of facilitated transition from a selection operation to a read/write operation such as a sense, set, or reset operation can be achieved. Other benefits associated with decoupling a high capacitance node and low capacitance node can be achieved. In such a case, reducing the capacitance on the bit-line electrode 108 may be preferable to reducing the capacitance on the word-line electrode 110.

Figure 3:
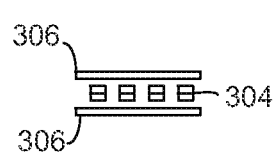
FIG. 3 schematically illustrates an example configuration of word-lines and bit-lines in accordance with some embodiments.

FIG. 3 schematically illustrates an example configuration of word-lines and bit-lines, in accordance with some embodiments. FIG. 3 is a cross-section schematic of a configuration of word-lines 306 and one or more bit-lines 304. The word-lines 306 have a lengthwise dimension that extends in a first direction along a plane of the page and the one or more bit-lines 304 have a lengthwise dimension that extends in a second direction in and out of the page, the first direction being substantially perpendicular to the second direction. The one or more bit-lines 304 may be disposed between the word-lines 306.

In some embodiments, the one or more bit-lines 304 may be formed to have a different final thickness in direction T, indicated by the arrow, than the one or more word-lines 304. In an embodiment, the one or more bit-lines 304 may be thicker than the one or more word-lines 306 to provide a larger parasitic capacitance per number of memory cells for the one or more bit-lines 304 relative to the one or more word-lines 306. Placing of the write circuitry, the sensing circuitry, and the current-limiting circuitry on the word-line electrode may mitigate the effects of the larger parasitic capacitance on the one or more bit-lines 304. That is, providing a larger thickness of the one or more bit-lines 304 relative to the one or more word-lines 306 may be facilitated by the configuration of sense circuitry, write circuitry, and current-limiting circuitry of a selection module on a lower potential electrode (e.g., the word-line electrode 110) as described for the memory device 100 of FIG. 1.

Figure 4:
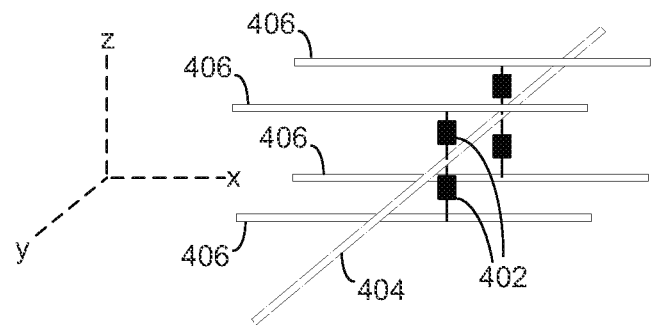
FIG. 4 schematically illustrates another example configuration of word-lines and bit-lines in accordance with some embodiments.

FIG. 4 schematically illustrates another example configuration of word-lines and bit-lines in accordance with some embodiments. FIG. 4 is a perspective view schematic of a three-dimensional configuration for word-lines 406 and one or more bit-lines 404. A three-dimensional axis is provided to show an x direction, y direction, and z direction, where the x, y, and z directions are each perpendicular to one another. The word-lines 406 may extend in the x direction and the one or more bit-lines 404 may extend in the y direction. The one or more bit-lines 404 may be disposed between the word-lines 406, as shown.

One or more memory cells 402 may be part of a three-dimensional array of memory cells in some embodiments. For example, the one or more memory cells 402 may be in a stacked configuration in the z direction. Each of the stacked memory cells may share a common bit-line of the one or more bit-lines 404 and may further be coupled to a different word-line of the word-lines 406, as shown.

In the configurations of FIGS. 3 and 4, the one or more bit-lines 304, 404 may be more susceptible to current leakage due to being positioned between the word-lines 306, 406 as shown. The one or more bit-lines 304, 404 may have a higher capacitance than the word-lines 306, 406 in some embodiments. Adverse effects of the current leakage and capacitance of the one or more bit-lines 304, 404 may be mitigated by placing the current-limiting circuitry of the selection module, sense circuitry, and write circuitry on the word-line electrode (e.g., the lower potential electrode) as described for the memory device 100 of FIG. 1. The embodiments of FIGS. 3 and 4 may be combined in some embodiments. According to various embodiments, the memory device 100 of FIG. 1 includes word-lines, bit-lines, and or memory cells that comport with the configurations of FIGS. 3 and/or 4.

Figure 5:
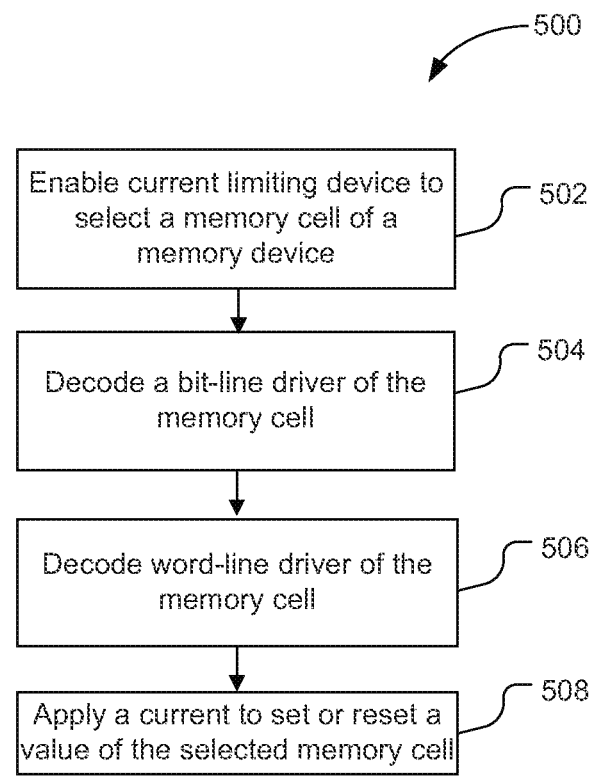
FIG. 5 is a flow diagram of a method for performing a write operation in accordance with some embodiments.

FIG. 5 is a flow diagram of a method 500 for performing a write operation in accordance with some embodiments. At 502, the method 500 includes enabling a current-limiting device (e.g., the current-limiting circuitry 122 of selection module 120 of FIG. 1) to select a memory cell (e.g., the one or more memory cells 102 of FIG. 1) of a memory device (e.g., the memory device 100 of FIG. 1). The current-limiting device may be enabled, for example, by applying a voltage to a transistor of the current-limiting circuitry. According to various embodiments, the current-limiting circuitry is enabled to limit a current of a lower potential electrode of the word-line electrode (e.g., the word-line electrode 110 of FIG. 1) and the bit-line electrode (e.g., the bit-line electrode 108 of FIG. 1) of the memory device. A write path (e.g., the lower potential electrode) of the memory device may be enabled prior to enabling the current-limiting device.

At 504, the method 500 further includes decoding a bit-line driver (e.g., the one or more bit-lines drivers 128 of FIG. 1) of the memory cell. At 506, the method 500 further includes decoding a word-line driver (e.g., the one or more word-line drivers 126 of FIG. 1) of the memory cell. The decoding at 504 and 506 may be performed by decoding circuitry, which may be part of or controlled by a selection module (e.g., the selection module 120 of FIG. 1) of the memory device. The decoding at 504 and 506 may be performed in any order and may be performed subsequent to enabling the current-limiting device. The actions at 502, 504, and 506 may be part of a selection phase to select the memory cell.

At 508, the method 500 further includes applying a current to set or reset a value of the selected memory cell. The current may be applied by write circuitry (e.g., the write circuitry 116 of FIG. 1) that is coupled to the lower potential electrode (e.g., the word-line electrode 110 of FIG. 1). In an embodiment, a current profile having a trapezoid shape is used to set the value of the selected memory cell and a current profile having a rectangular shape is used to reset the value.

In some embodiments, the method 500 expressly does not include a bypass operation that bypasses the current-limiting device between a selection phase of the memory cell (e.g., actions at 502, 504, and 506) and applying the current (e.g., action at 508). The bypass operation may be used for a case where the write circuitry does not share a common electrode (e.g., the word-line electrode 110 of FIG. 1) with the current-limiting circuitry. For example, in such a case, the bypass operation may include handing off current control for a target memory cell to the opposite electrode (e.g., the bit-line electrode) to provide the write current profile.

Figure 6:
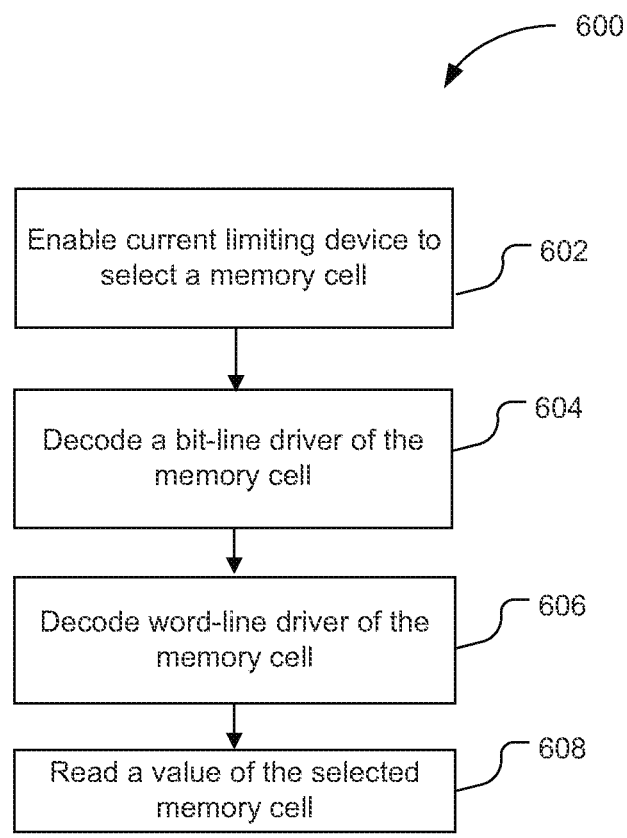
FIG. 6 is a flow diagram of a method for performing a read operation in accordance with some embodiments.

FIG. 6 is a flow diagram of a method 600 for performing a read operation in accordance with some embodiments. At 602, the method 600 includes enabling a current-limiting device (e.g., the current-limiting circuitry 122 of selection module 120 of FIG. 1) to select a memory cell (e.g., the one or more memory cells 102 of FIG. 1) of a memory device (e.g., the memory device 100 of FIG. 1). The current-limiting device may be enabled, for example, by applying a voltage to a transistor of the current-limiting circuitry. According to various embodiments, the current-limiting circuitry is enabled to limit a current of a lower potential electrode of the word-line electrode (e.g., the word-line electrode 110 of FIG. 1) and the bit-line electrode (e.g., the bit-line electrode 108 of FIG. 1) of the memory device. A sensing path (e.g., the lower potential electrode) of the memory device may be enabled prior to enabling the current-limiting device.

At 604, the method 600 further includes decoding a bit-line driver (e.g., the one or more bit-line drivers 128 of FIG. 1) of the memory cell. At 606, the method 600 further includes decoding a word-line driver (e.g., the one or more word-line drivers 126 of FIG. 1) of the memory cell. The decoding at 604 and 606 may be performed by decoding circuitry, which may be part of a selection module (e.g., the selection module 120 of FIG. 1) of the memory device. The decoding at 604 and 606 may be performed in any order and may be performed subsequent to enabling the current-limiting device. The actions at 602, 604, and 606 may be part of a selection phase to select the memory cell.

At 608, the method 600 further includes reading a value of the selected memory cell. The value of the selected cell may be performed by sensing circuitry (e.g., the sensing circuitry 112 of FIG. 1) that is coupled to the lower potential electrode. For example, a voltage comparator (e.g., the voltage comparator 114 of FIG. 1) may be used to detect a state of the cell.

In some embodiments, the method 600 expressly does not include a bypass operation that bypasses the current-limiting device between a selection phase of the memory cell (e.g., actions at 602, 604, and 606) and applying the current (e.g., action at 608). The bypass operation may be used for a case where the sensing circuitry does not share a common electrode (e.g., the word-line electrode 110 of FIG. 1) with the current-limiting circuitry. The sensing circuitry, the write circuitry, and the current-limiting circuitry may share a common electrical load in some embodiments. The common electrical load may be configured to support the current control functions for the sensing circuitry, write circuitry, and current-limiting circuitry.

An article of manufacture is disclosed. In some embodiments, the article of manufacture includes non-transitory storage such as, for example, the non-volatile memory (NVM)/storage 716 of FIG. 7. The article of manufacture may have instructions stored thereon, that if executed by a processor, cause the actions of method 500 of FIG. 5 or method 600 of FIG. 6 to be performed.

Figure 7:
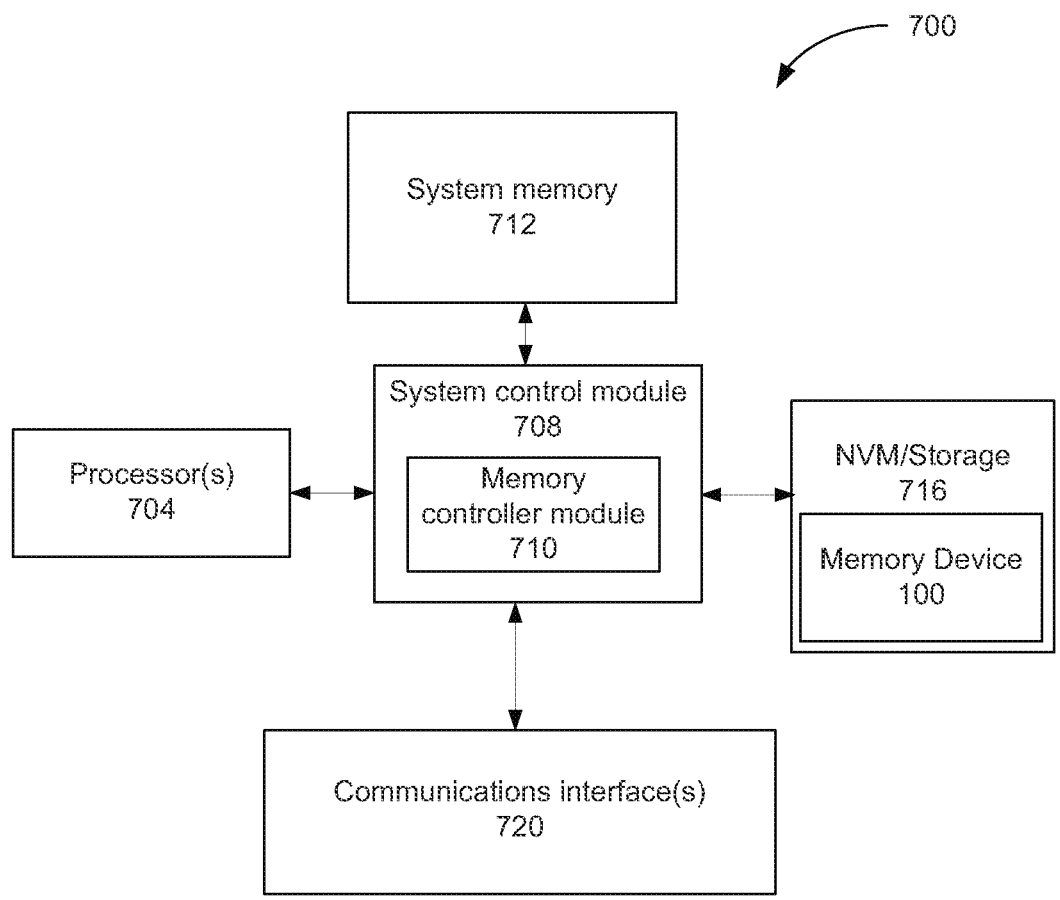
FIG. 7 schematically illustrates an example system that may comport with various embodiments described herein.

Embodiments of the present disclosure may be implemented into a system using any suitable hardware and/or software to configure as desired. FIG. 7 schematically illustrates an example system 700 that may comport with various embodiments described herein. In one embodiment, the system 700 comprises one or more processor(s) 704, system control module 708 coupled to at least one of the processor(s) 704, system memory 712 coupled to system control module 708, non-volatile memory (NVM)/storage 716 coupled to system control module 708, and one or more communications interface(s) 720 coupled to system control module 708.

System control module 708 for one embodiment may include any suitable interface controllers to provide for any suitable interface to at least one of the processor(s) 704 and/or to any suitable device or component in communication with system control module 708.

System control module 708 may include a memory controller module 710 to provide an interface to system memory 712. The memory controller module 710 may be a hardware module, a software module, and/or a firmware module.

System memory 712 may be used to load and store data and/or instructions, for example, for system 700. System memory 712 for one embodiment may include any suitable volatile memory, such as suitable DRAM, for example.

System control module 708 for one embodiment may include one or more input/output (I/O) controller(s) to provide an interface to NVM/storage 716 and communications interface(s) 720.

The NVM/storage 716 may be used to store data and/or instructions, for example. NVM/storage 716 may include any suitable non-volatile memory, such as PCM or flash memory, for example, and/or may include any suitable non-volatile storage device(s), such as one or more hard disk drive(s) (HDD(s)), one or more compact disc (CD) drive(s), and/or one or more digital versatile disc (DVD) drive(s) for example. According to various embodiments, the NVM/storage 716 includes a memory device 100 as described herein. The memory device 100 may perform actions of methods 500 and 600 of FIGS. 5 and 6 in response to instructions from the one or more processor(s) 704.

The NVM/storage 716 may include a storage resource physically part of a device on which the system 700 is installed or it may be accessible by, but not necessarily a part of, the device. For example, the NVM/storage 716 may be accessed over a network via the communications interface(s) 720.

Communications interface(s) 720 may provide an interface for system 700 to communicate over one or more wired or wireless network(s) and/or with any other suitable device.

For one embodiment, at least one of the processor(s) 704 may be packaged together with logic for one or more controller(s) of system control module 708, e.g., memory controller module 710. For one embodiment, at least one of the processor(s) 704 may be packaged together with logic for one or more controllers of system control module 708 to form a System in Package (SiP). For one embodiment, at least one of the processor(s) 704 may be integrated on the same die with logic for one or more controller(s) of system control module 708. For one embodiment, at least one of the processor(s) 704 may be integrated on the same die with logic for one or more controller(s) of system control module 708 to form a System on Chip (SoC).

In various embodiments, the system 700 may be, but is not limited to, a server, a workstation, a desktop computing device, or a mobile computing device (e.g., a laptop computing device, a handheld computing device, a handset, a tablet, a netbook, etc.). In various embodiments, the system 700 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
a memory cell of a memory device;
a bit-line coupled to the memory cell;
a word-line coupled to the memory cell;
a bit-line electrode coupled to the bit-line;
a word-line electrode coupled to the word-line;
current-limiting circuitry of a selection module coupled to the word-line electrode, the current-limiting circuitry to facilitate a selection operation of the memory cell by the selection module;
sensing circuitry coupled to the word-line electrode, the sensing circuitry to perform a read operation of the memory cell; and
write circuitry coupled to the word-line electrode, the write circuitry to perform a write operation of the memory cell,
wherein the apparatus is configured to provide a potential of the word-line electrode that is lower than a potential of the bit-line electrode, and
wherein the apparatus is configured to provide a capacitance of the word-line electrode that is lower than a capacitance of the bit-line electrode.

2. The apparatus of claim 1, wherein the current-limiting circuitry comprises a current-mirror circuit.

3. The apparatus of claim 1, wherein the current-limiting circuitry comprises a transistor gate that is configured to limit a current of the word-line electrode path to a maximum current level.

4. The apparatus of claim 1, wherein the memory cell is a memory cell of a three-dimensional array of memory cells, the word-line is a first word-line extending in a first dimension of the three-dimensional array, the bit-line extends in a second dimension of the three-dimensional array, and the memory cell is a first memory cell, the apparatus further comprising:
a second memory cell of the three-dimensional array of memory cells, the second memory cell being in a stacked configuration with the first memory cell in a third dimension of the three-dimensional array; and
a second word-line coupled to the word-line electrode and further coupled to the second memory cell, wherein the bit-line extends between the first word-line and the second word-line.

5. The apparatus of claim 1, wherein:
the memory cell, the bit-line, and the word-line are part of a tile comprising a plurality of memory cells, bit-lines, and word-lines;
the tile has a first linear dimension that extends in a direction that is parallel to a lengthwise dimension of the bit-line;
the tile has a second linear dimension that extends in a direction that is parallel to a lengthwise dimension of the word-line;
the first linear dimension is greater than the second linear dimension; and
the tile comprises a same number of bit-lines and word-lines.

6. The apparatus of claim 1, wherein the write circuitry comprises a current profile generator to generate a current profile for a set or reset operation of the memory cell.

7. The apparatus of claim 1, wherein the sensing circuitry comprises a voltage comparator.

8. The apparatus of claim 1, wherein the memory device is a phase change memory and switch (PCMS) device.

9. A method comprising:
enabling current-limiting circuitry of a selection module to limit a current of as a word-line electrode, the selection module being configured to select a memory cell of a phase change memory (PCM) device;
decoding a bit-line driver and a word-line driver to select a memory cell of the PCM device; and
applying, by write circuitry coupled to the word-line electrode, a current to set or reset a value of the selected memory cell,
wherein:
a potential of the word-line electrode is lower than a potential of a bit-line electrode that is coupled with the memory cell, and
wherein a capacitance of the word-line electrode is lower than a capacitance of the bit-line electrode.

10. The method of claim 9, wherein enabling the current-limiting circuitry comprises:
applying a voltage to a transistor of the current-limiting circuitry.

11. The method of claim 9, wherein applying the current comprises applying a current profile having a trapezoid shape to set the value of the selected memory cell or applying a current profile having a rectangular shape to reset the value of the selected memory cell.

12. The method of claim 9, further comprising:
reading the value of the selected memory cell.

13. The method of claim 12, wherein reading the value is performed by enabling sensing circuitry coupled to the word-line electrode.

14. The method of claim 13, wherein:
the sensing circuitry, the current-limiting circuitry, and the write circuitry share a common electrical load of the word-line electrode.

15. A method comprising:
enabling current-limiting circuitry of a selection module to limit a current of a word-line electrode of a phase change memory and switch (PCMS) device, the selection module being configured to select a memory cell of the PCMS device;
decoding a bit-line driver and a word-line driver to select a memory cell of the PCMS device; and
reading, by sensing circuitry coupled to the word-line electrode, a value of the selected memory cell,
wherein:
a potential of the word-line electrode is lower than a potential of a bit-line electrode that is coupled with the memory cell, and
wherein a capacitance of the word-line electrode is lower than a capacitance of the bit-line electrode.

16. The method of claim 15, wherein the decoding is performed subsequent to enabling the current-limiting circuitry.

17. The method of claim 15, wherein no bypass operation is performed to bypass the current-limiting circuitry subsequent to enabling the current-limiting circuitry and prior to reading the value of the selected memory cell.

18. An apparatus comprising:
a first memory cell of a three-dimensional array of memory cells;
a bit-line coupled to the first memory cell;
a first word-line coupled to the first memory cell;
a bit-line electrode coupled to the bit-line;
a word-line electrode coupled to the first word-line;
current-limiting circuitry of a selection module coupled to the word-line electrode, the current-limiting circuitry to facilitate a selection operation of the memory cell by the selection module;
sensing circuitry coupled to the word-line electrode, the sensing circuitry to perform a read operation of the memory cell; and
write circuitry coupled to the word-line electrode, the write circuitry to perform a write operation of the memory cell,
wherein the apparatus is configured to provide a potential of the word-line electrode that is lower than a potential of the bit-line electrode, and
wherein the first word-line extends in a first dimension of the three-dimensional array and the bit-line extends in a second dimension of the three-dimensional array, the apparatus further comprising:
a second memory cell of the three-dimensional array of memory cells, the second memory cell being in a stacked configuration with the first memory cell in a third dimension of the three-dimensional array; and
a second word-line coupled to the word-line electrode and further coupled to the second memory cell, wherein the bit-line extends between the first word-line and the second word-line.

19. The apparatus of claim 18, wherein the current-limiting circuitry comprises a current-mirror circuit.

20. An apparatus comprising:
a memory cell of a memory device;
a bit-line coupled to the memory cell;
a word-line coupled to the memory cell;
a bit-line electrode coupled to the bit-line;
a word-line electrode coupled to the word-line;
current-limiting circuitry of a selection module coupled to the word-line electrode, the current-limiting circuitry to facilitate a selection operation of the memory cell by the selection module;
sensing circuitry coupled to the word-line electrode, the sensing circuitry to perform a read operation of the memory cell; and
write circuitry coupled to the word-line electrode, the write circuitry to perform a write operation of the memory cell, wherein:
the apparatus is configured to provide a potential of the word-line electrode that is lower than a potential of the bit-line electrode,
the memory cell, the bit-line, and the word-line are part of a tile comprising a plurality of memory cells, bit-lines, and word-lines,
the tile has a first linear dimension that extends in a direction that is parallel to a lengthwise dimension of the bit-line and a second linear dimension that extends in a direction that is parallel to a lengthwise dimension of the word-line;
the first linear dimension is greater than the second linear dimension; and
the tile comprises a same number of bit-lines and word-lines.

21. The apparatus of claim 20, wherein the current-limiting circuitry comprises a transistor gate that is configured to limit a current of the word-line electrode to a maximum current level.

* * * * *